US007223524B2

(12) United States Patent
Hiller et al.

(10) Patent No.: US 7,223,524 B2
(45) Date of Patent: May 29, 2007

(54) LASER-ENGRAVABLE FLEXOGRAPHIC PRINTING ELEMENT CONTAINING A CONDUCTIVE CARBON BLACK AND METHOD FOR PRODUCTION OF FLEXOGRAPHIC PRINTING FORMS

(75) Inventors: Margit Hiller, Karlstadt (DE); Thomas Telser, Heidelberg (DE); Uwe Stebani, Flörsheim-Dalsheim (DE); Fritz Nimtz, Leimen (DE); Heinz Faulhaber, Ludwigshafen (DE)

(73) Assignee: XSYS Print Solutions Deutschland GmbH, Stuttgart (DE)

( * ) Notice: Subject to any disclaimer, the term of this patent is extended or adjusted under 35 U.S.C. 154(b) by 86 days.

(21) Appl. No.: 10/512,193

(22) PCT Filed: Apr. 14, 2004

(86) PCT No.: PCT/EP2004/003954

§ 371 (c)(1),
(2), (4) Date: Nov. 17, 2004

(87) PCT Pub. No.: WO2004/091927

PCT Pub. Date: Oct. 28, 2004

(65) Prior Publication Data

US 2005/0115920 A1 Jun. 2, 2005

(30) Foreign Application Priority Data

Apr. 17, 2003 (DE) ................................ 103 18 039

(51) Int. Cl.
*G03F 7/004* (2006.01)
*G03F 7/20* (2006.01)

(52) U.S. Cl. .................. 430/281.1; 430/302; 430/306; 430/494; 430/944; 430/945

(58) Field of Classification Search ............. 430/281.1, 430/302, 306, 494, 944, 945
See application file for complete search history.

(56) References Cited

U.S. PATENT DOCUMENTS

| | | | | |
|---|---|---|---|---|
| 6,355,395 | B1 | 3/2002 | Zwez et al. | |
| 2001/0026902 | A1* | 10/2001 | Hirano et al. | 430/272.1 |
| 2001/0052924 | A1* | 12/2001 | Steinke et al. | 347/225 |
| 2002/0081529 | A1* | 6/2002 | Sonokawa | 430/303 |
| 2002/0136969 | A1* | 9/2002 | Hiller et al. | 430/18 |
| 2004/0031409 | A1* | 2/2004 | Hirano et al. | 101/463.1 |
| 2004/0229163 | A1* | 11/2004 | Sonokawa et al. | 430/271.1 |

FOREIGN PATENT DOCUMENTS

| | | | |
|---|---|---|---|
| EP | 0 084 851 | A2 | 1/1982 |
| EP | 0 084 851 | B1 | 1/1983 |
| EP | 0 332 070 | | 9/1989 |
| EP | 0 640 044 | B1 | 3/1996 |
| EP | 1 080 883 | A2 | 3/2001 |

(Continued)

*Primary Examiner*—Barbara L. Gilliam
(74) *Attorney, Agent, or Firm*—Nixon & Vanderhye, P.C.

(57) ABSTRACT

In a laser-engravable flexographic printing element, the relief-forming layer comprises a conductivity carbon black having a specific surface area of at least 150 $m^2/g$ and a DBP number of at least 150 ml/100 g. Flexographic printing plates are produced by a process in which a printing relief is engraved into said flexographic printing element by means of a laser system.

10 Claims, 2 Drawing Sheets

FOREIGN PATENT DOCUMENTS

| | | | |
|---|---|---|---|
| EP | 1 112 843 A2 | * | 7/2001 |
| EP | 1 213 615 A2 | | 6/2002 |
| EP | 1 262 315 A1 | | 12/2002 |
| JP | 2002-287335 | * | 10/2002 |
| WO | WO 90/11344 | | 10/1990 |
| WO | WO 03/011596 A1 | | 2/2003 |

* cited by examiner

LASER-ENGRAVABLE FLEXOGRAPHIC PRINTING ELEMENT CONTAINING A CONDUCTIVE CARBON BLACK AND METHOD FOR PRODUCTION OF FLEXOGRAPHIC PRINTING FORMS

This application is the US national phase of international application PCT/EP2004/003954 filed 14 Apr. 2004 which designated the U.S. and claims benefit of DE 10318039.7, dated 17 Apr. 2003, the entire content of which is hereby incorporated by reference.

FIELD OF THE INVENTION

The present invention relates to a laser-engravable flexographic printing element in which at least one relief-forming layer contains a conductivity carbon black having a specific surface area of at least 150 $m^2/g$ and a DBP number of at least 150 ml/100 g. The present invention furthermore relates to a process for the production of flexographic printing plates, in which a printing relief is engraved into said flexographic printing element by means of a laser system.

BACKGROUND AND SUMMARY OF THE INVENTION

In direct laser engraving for the production of flexographic printing plates, a printing relief is engraved directly into a relief-forming layer suitable for this purpose with the use of a laser or of a laser system. The layer is decomposed in the areas in which the laser beam is incident on it and is removed substantially in the form of dusts, gases, vapors or aerosols. A development step as in the case of conventional processes—thermally or by means of washout agents—is not required.

Although the engraving of rubber printing cylinders by means of lasers has in principle been known since the 1960s, laser engraving has acquired broader economic interest only in recent years with the arrival of improved laser systems. The improvements of the laser systems include in particular better focusability of the laser beam, higher power and computer-controlled beam modulation.

With the introduction of new, more efficient laser systems, however, the question regarding particularly suitable materials for laser-engravable flexographic printing plates is also becoming more and more important. Particularly in the engraving of high-resolution printing plates or very fine relief elements, problems now occur which played no role at all in the past because laser systems in any case did not permit the engraving of very fine structures. Improved laser systems thus lead to new requirements with respect to the material.

In direct laser engraving, it should be noted in particular that the relief-forming layer which is engraved by means of the laser also forms the subsequent printing surface. All defects which occur during the engraving are thus also visible on printing. In direct laser engraving, in particular the edges of the relief elements must therefore be formed particularly precisely in order to obtain a crisp printing image. Frayed edges or beads of molten material around relief elements, i.e. melt edges, have a considerable adverse effect on the printed image. Of course, the finer the desired relief elements, the more important are these factors. EP-B 640 043 and EP-B 640 044 have proposed amplifying laser-engravable flexographic printing elements and if necessary adding materials which absorb laser radiation for improving the sensitivity. The use of carbon black is also proposed without this being specified more precisely.

Carbon black is not a defined chemical compound; instead, there is a very large number of different carbon blacks which differ with regard to preparation process, particle size, specific surface area or surface properties and which accordingly also have a very wide range of chemical and physical properties. For further details, reference may be made, for example, to H. Ferch, Pigmentruβe, edited by U. Zorll, Vincentz Verlag, Hanover, 1995. Carbon blacks are frequently characterized by the specific surface area, for example determined by the BET method, and the structure. A skilled worker in the area of carbon blacks understands structure as meaning the linkage of the primary particles to form aggregates. The structure is frequently determined by means of the dibutyl phthalate (DBP) adsorption. The higher the DBP adsorption, the higher the structure.

The conductivity carbon blacks form a special class of carbon blacks. In general, carbon blacks having a DBP adsorption of more than 110 ml/100 g and a relatively high specific surface are referred to as conductivity carbon blacks (Ferch loc.cit., p 82). Conductivity carbon blacks are usually used for making nonconductive materials electrically conductive with the addition of a very small amount.

The use of carbon black in laser-engravable flexographic printing elements has also been described by EP-A 1 080 883, WO 02/16134, WO 02/54154 or WO 02/083418. Said publications, however, disclose not conductivity carbon blacks but carbon blacks having a relatively small specific surface area and small DBP number.

EP-A 1 262 315 and EP-A 1 262 316 disclose a process and a laser system for the production of flexographic printing plates. The laser system described operates with a plurality of laser beams which may have different power and/or wavelength, and by means of which the surface regions of the printing plate and deeper regions can each be processed separately. Reference is made to the possibility of making the surface of the flexographic printing element used different to the regions located underneath. However, the documents contain no proposals at all with regard to a specific chemical composition for the surface or the regions located underneath.

It is an object of the present invention to provide a one-layer or multilayer laser-engravable flexographic printing element which also permits the engraving of fine relief elements with high precision without the occurrence of melt edges. It should be suitable in particular for engraving using modern multibeam laser systems.

We have found, surprisingly, that this object is achieved by the use of conductivity carbon blacks of the type defined at the outset. The flexographic printing elements can be engraved with high resolution without melt edges and other adverse effects being observed. The result was surprising in particular because said carbon blacks are by no means those which have the highest sensitivity to laser radiation.

Accordingly, flexographic printing elements for the production of flexographic printing plates by means of laser engraving have been found, which at least comprise, arranged one on top of the other, a dimensionally stable substrate and at least one relief-forming, crosslinked elastomeric layer (A) having a thickness of from 0.05 to 7 mm, obtainable by crosslinking a layer which comprises at least one elastomeric binder (a1), a substance (a2) absorbing laser radiation and components for crosslinking (a3), wherein the substance absorbing laser radiation is a conductivity carbon black having a specific surface area of at least 150 $m^2/g$ and a DBP number of at least 150 ml 100 g.

DETAILED DESCRIPTION OF THE DRAWINGS

Figure 1:
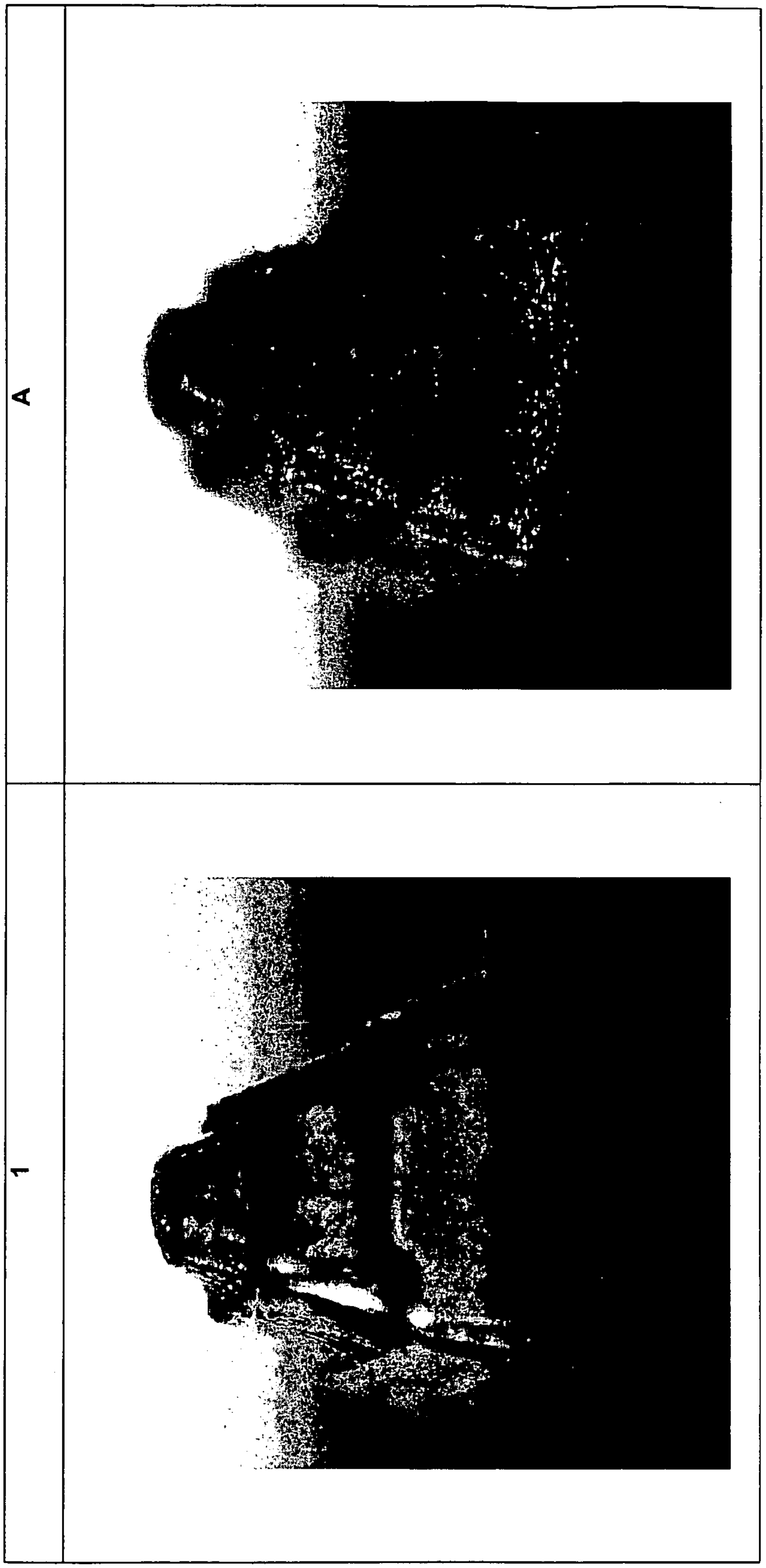
FIGS. 1 and 2 show optical micrographs of a 50 μm positive dot of a flexographic printing plate according to example 1 and according to comparative examples A, B and C.

In a particular embodiment, the flexographic printing element furthermore comprises at least one further, relief-forming, crosslinked elastomeric layer (B) between the substrate and layer (A), obtainable by crosslinking a layer which comprises at least one elastomeric binder (b1) and components for crosslinking.

A process for the production of flexographic printing plates has furthermore been found, in which a flexographic printing element of the abovementioned type is used and a printing relief is engraved with the aid of a laser system into the layer (A) and, if required, a layer (B), the depth of the relief elements to be engraved by means of the laser being at least 0.03 mm.

Regarding the invention, the following may be stated specifically:

Examples of suitable dimensionally stable substrates for the novel flexographic printing elements are plates, films and conical and cylindrical tubes (sleeves) of metals, such as steel, aluminum, copper or nickel, or of plastics, such as polyethylene terephthalate (PET), polyethylene naphthalate (PEN), polybutylene terephthalate, polyamide, polycarbonate, if desired also woven fabrics and nonwovens, such as glass fiber fabrics and composite materials, for example comprising glass fibers and plastics. Particularly suitable dimensionally stable substrates are dimensionally stable substrate films, for example polyester films, in particular PET or PEN films, or flexible metallic substrates, such as thin sheets or metal foils of steel, preferably of stainless steel, magnetizable spring steel, aluminum, zinc, magnesium, nickel, chromium or copper.

The flexographic printing element furthermore comprises at least one relief-forming, crosslinked elastomeric layer (A). Said layer may be applied directly to the substrate. Optionally, however, other layers, for example adhesion-promoting layers and/or resilient lower layers and/or at least one further relief-forming, crosslinked, elastomeric layer (B), may also be present between the substrate and the relief layer.

The crosslinked, elastomeric layer (A) is obtainable by crosslinking a layer which comprises at least one binder (a1), a substance (a2) absorbing laser radiation and components for crosslinking (a3). The layer (A) itself consequently comprises the binder (a1), the substance (a2) absorbing laser radiation and the network which is produced by the reaction of the components (a3) and may or may not include the binder.

Particularly suitable binders (a1) for layer (A) are elastomeric binders. However, it is also possible in principle to use nonelastomeric binders. All that is decisive is that the crosslinked layer (A) has elastomeric properties. The recording layer may assume elastomeric properties, for example, by the addition of plasticizers to a binder not elastomeric per se, or it is possible to use crosslinkable oligomers which form an elastomeric network only by reaction with one another.

Particularly suitable elastomeric binders (a1) for layer (A) are those polymers which contain 1,3-diene monomers, such as isoprene or butadiene, incorporated in the form of polymerized units. Depending on the method of incorporation of the monomers, binders of this type have crosslinkable olefin groups as component of the main chain and/or as a side group. Examples are natural rubber, polybutadiene, polyisoprene, styrene/butadiene rubber, nitrile/butadiene rubber, butyl rubber, styrene/isoprene rubber, polynorbornene rubber and ethylene/propylene/diene rubber (EPDM).

The binders (a1) may also be thermoplastic elastomeric block copolymers of alkenylaromatics and 1,3-dienes. The block copolymers may be either linear block copolymers or free radical block copolymers. Usually, they are three-block copolymers of the A-B-A type but may also be two-block polymers of the A-B type, or those having a plurality of alternating elastomeric and thermoplastic blocks, e.g. A-B-A-B-A. Mixtures of two or more different block copolymers may also be used. Commercial three-block copolymers frequently contain certain proportions of two-block copolymers. The diene units may be differently linked. They may also be completely or partly hydrogenated. Both block copolymers of the styrene/butadiene type and those of the styrene/isoprene type may be used. They are commercially available, for example, under the name Kraton®. Thermoplastic elastomeric block copolymers having terminal blocks of styrene and a random styrene/butadiene middle block may furthermore be used and are available under the name Styroflex®.

However, ethylene/propylene, ethylene/acrylate, ethylene/vinyl acetate or acrylate rubbers can in principle also be used for the layer (A). Hydrogenated rubbers or elastomeric polyurethanes, and modified binders in which crosslinkable groups are introduced into the polymeric molecule by grafting reactions, are furthermore suitable.

The type and amount of the binder (a1) are chosen by a person skilled in the art according to the desired properties of the printing relief of the flexographic printing element. As a rule, an amount of from 40 to 95% by weight, based on the amount of all components of layer (A), of the binder has proven useful. Mixtures of different binders can of course also be used.

According to the invention, the substance (a2) absorbing laser radiation may be a conductivity carbon black having a specific surface area of at least 150 $m^2/g$ and a DBP number of at least 150 ml/100 g.

The specific surface area is preferably at least 250, particularly preferably at least 500, $m^2/g$. The DBP number is preferably at least 200, particularly preferably at least 250, ml/100 g. Said carbon blacks may be acidic or basic carbon blacks. The carbon blacks (a2) are preferably basic carbon blacks. Mixtures of different binders can of course also be used.

Suitable conductivity carbon blacks having a specific surface area of up to about 1500 $m^2/g$ and DBP numbers up to about 550 ml/100 g are commercially available, for example under the names Ketjenblack® EC300 J, Ketjenblack® EC600 J (from Akzo), Printex® XE (from Degussa) or Black Pearls® 2000 (from Cabot).

The type and amount of the carbon black (a2) are chosen by a person skilled in the art according to the desired properties of the printing relief. The amount also depends on whether the layer (A) is present as the only relief-forming layer or whether at least one further relief-forming layer (A)

and/or (B) is also present. If the novel flexographic printing element comprises only a single layer (A) as the relief-forming layer, an amount of from 0.5 to 20% by weight, based on the amount of all components of layer (A), of the carbon black has generally proven useful. An amount of from 3 to 18% is preferred, very particularly preferably from 5 to 15%. If said flexographic printing element is a multi-layer flexographic printing element which also comprises further layers (A) and/or (B) in addition to a layer (A), the carbon black content in the uppermost layer (A) may also be greater, for example up to 35% by weight, and in particular cases even higher. The thickness of such an uppermost layer (A) having a carbon black content greater than 20% by weight should as a rule not exceed 0.3 mm.

The type and amount of the components for crosslinking (a3) depend on the desired crosslinking technique and are chosen accordingly by a person skilled in the art. The crosslinking is preferably carried out thermochemically by heating the layer or by irradiation by means of electron beams. Since, owing to the carbon black contained, the layer is more or less black, photochemical crosslinking is possible only in exceptional cases, i.e. if the carbon black content is only very low and/or the layer is only very thin.

Thermal crosslinking can be carried out by adding polymerizable compounds or monomers to the layer. The monomers have at least one polymerizable, olefinically unsaturated group. In a manner known in principle, suitable monomers are esters or amides of acrylic acid or methacrylic acid with mono- or polyfunctional alcohols, amines, amino alcohols or hydroxyethers and hydroxyesters, styrene or substituted styrenes, esters of fumaric or maleic acid or allyl compounds. The total amount of any monomers used is established by a person skilled in the art according to the desired properties of the relief layer. As a rule, however, 30% by weight, based on the amount of all components of the layer, should not be exceeded.

Furthermore, a thermal polymerization initiator can be added. In principle, commercial thermal initiators for free radical polymerization can be used as polymerization initiators, for example suitable peroxides, hydroperoxides or azo compounds. Typical vulcanizers can also be used for the crosslinking.

The thermal crosslinking can also be carried out by adding a heat-curable resin, for example an epoxy resin, as a crosslinking component to the layer.

If the binder (a1) used has a sufficient amount of crosslinkable groups, the addition of additional crosslinkable monomers or oligomers is not necessary and instead the binder can be crosslinked directly by means of suitable crosslinking agents. This is possible particularly in the case of natural rubber or synthetic rubber, which can be crosslinked directly using conventional vulcanizers or peroxide crosslinking agents.

Crosslinking by means of electron beams can be carried out on the one hand similarly to thermal crosslinking by crosslinking the layers containing monomers comprising ethylenically unsaturated groups by means of electron beams. The addition of initiators is not necessary here. By means of electron beams, binders which have groups crosslinking by means of electron beams can also be crosslinked directly, without the addition of further monomers. Such groups include in particular olefinic groups, protic groups, for example —OH, —$NH_2$, —NHR, —COOH or —$SO_3H$, and groups which can form stabilized radicals and cations, e.g. —CR'R"—, —CH(O—CO—$CH_3$)—, —CH(O—$CH_3$)—, —CH(NR'R")— or —CH(CO—O—$CH_3$). Compounds having protic groups may additionally be used. Examples include di- or polyfunctional monomers in which terminal functional groups are linked to one another via a spacer, such as dialcohols, for example 1,4-butanediol, 1,6-hexanediol, 1,8-octanediol or 1,9-nonanediol, diamines, for example 1,6-hexanediamine or 1,8-hexanediamine, dicarboxylic acids, for example 1,6-hexanedicarboxylic acid, terephthalic acid, maleic acid or fumaric acid.

Photochemical crosslinking can be carried out by using the olefinic monomers described above in combination with at least one suitable photoinitiator or a photoinitiator system. Suitable initiators for the photopolymerization are known to be benzoin or benzoin derivatives, such as α-methylbenzoin or benzoin ethers, benzil derivatives, such as benzil ketals, acylarylphosphine oxides, acylarylphosphinic esters and polynuclear quinones, without it being intended to restrict the list thereto.

Layer (A) can of course optionally also comprise further components, for example plasticizers, dyes, dispersants, adhesion-promoting additives, antistatic agents, abrasive particles or processing assistants. The amount of such additives serves for tailoring the properties and should as a rule not exceed 30% by weight, based on the amount of all components of layer (A) of the recording element.

The novel flexographic printing element may comprise only a single layer (A) as the relief-forming layer. It may also have two or more layers (A) one on top of the other, it being possible for these layers to have the same composition or different compositions.

The novel flexographic printing element can optionally also have at least one further, relief-forming, crosslinked elastomeric layer (B) between the substrate and layer (A). Two or more layers (B) of the same composition or different compositions may also be present.

Layer (B) is obtainable by crosslinking a layer which comprises at least one binder (b1) and components for crosslinking (b3). Suitable binders (b1) and components for crosslinking (b3) can be selected by a person skilled in the art from the same lists as those mentioned in the case of (a1) and (a3). Layer (B) can of course optionally also comprise further components, for example plasticizers, dyes, dispersants, adhesion-promoting additives, antistatic agents, processing assistants or abrasive particles.

In a particularly preferred embodiment of (B), the binder (b1) is a thermoplastic elastomeric binder. Since an absorber for laser radiation is not absolutely essential for the layer (B), layers transparent to light in the UV/VIS range can also be produced. In this case, the layer may also be photochemically crosslinked in a particularly elegant manner.

The layer (B) can nevertheless optionally contain a substance (b2) absorbing laser radiation. Mixtures of different absorbers for laser radiation may also be used. Suitable absorbers for laser radiation have a high absorption in the region of the laser wavelength. Particularly suitable absorbers are those which have a high absorption in the near infrared and in the longer-wave VIS range of the electromagnetic spectrum. Such absorbers are particularly suitable for absorbing radiation of powerful Nd—YAG lasers (1 064 nm) and of IR diode lasers, which typically have wavelengths of from 700 to 900 nm and from 1 200 to 1 600 nm.

Examples of suitable absorbers for laser radiation (b2) are dyes which absorb strongly in the infrared spectral range, for example phthalocyanines, naphthalocyanines, cyanines, quinones, metal complex dyes, such as dithiolenes, or photochromic dyes.

Other suitable absorbers are inorganic pigments, in particular intensely colored inorganic pigments, for example chromium oxides, iron oxides or hydrated iron oxides.

Particularly suitable substances absorbing laser radiation are finely divided carbon black grades, the choice in the case (b2) not being limited to the abovementioned conductivity carbon blacks. It is also possible to use carbon blacks having a relatively low specific surface area and relatively low DBP absorption. Examples of further suitable carbon blacks include Printex® U, Printex® A or Spezialschwarz® 4 (from Degussa).

The laser-engravable flexographic printing element can optionally also comprise further layers.

Examples of such layers include elastomeric lower layers comprising a different formulation, which are present between the substrate and the laser-engravable layer or layers and which need not necessarily be laser-engravable. By means of such lower layers, the mechanical properties of the relief printing plates can be modified without influencing the properties of the actual printing relief layer.

The same purpose is served by resilient substructures which are present under the dimensionally stable substrate of the laser-engravable flexographic printing element, i.e. on that side of the substrate which faces away from the laser-engravable relief layer.

Further examples include adhesion-promoting layers which bond the substrate to layers present above or different layers to one another.

Furthermore, the laser-engravable flexographic printing element can be protected from mechanical damage by a protective film which consists, for example, of PET and is present on the respective uppermost layer and which has to be removed before the engraving by means of lasers. To make it easier to peel off, the protective film can be surface-treated in a suitable manner, for example by siliconization, provided that the relief surface is not adversely affected in its printing properties by the surface treatment.

The thickness of layer (A) and optionally layer (B) is suitably chosen by a person skilled in the art according to the type and the desired purpose of the flexographic printing plate.

The thickness of layer (A) is usually from 0.05 to 7 mm. If layer (A) is used as the only relief-forming layer, the thickness should not be less than 0.2 mm. In the case of a one-layer flexographic printing element, a thickness of from 0.3 to 7 mm, preferably from 0.5 to 5 mm, particularly preferably from 0.7 to 4 mm, has proven particularly useful.

If the layer (A) is used as the top layer in combination with a second relief-forming layer (B), a relatively thin layer (A) may also be used. In this case, a thickness of from 0.05 to 0.3 mm, preferably from 0.07 to 0.2 mm, for example about 0.1 mm, has proven particularly useful. The total thickness of layer (A), layer (B) and any further layers together should as a rule be from 0.3 to 7 mm, preferably from 0.5 to 5 mm.

If the novel flexographic printing element has two layers (A) and (B), it has proven particularly useful if the top layer (A) has the same or a greater Shore A hardness than the lower layer (B), without it being intended to limit the invention thereto. This can be achieved, for example, by the choice of the respective degree of crosslinking and/or by a suitable choice of the binders. It has proven particularly useful to employ a natural or synthetic rubber as binder (a1) for the layer (A) in a two-layer flexographic printing element of this type. For layer (B), it has proven useful to employ a thermoplastic elastomeric binder as binder (b1), preferably a block copolymer of the styrene/isoprene or of the styrene/butadiene type, particularly preferably of the styrene/butadiene type. In the preferred embodiment of a two-layer or multilayer flexographic printing element, the layer (B) has no additional absorber for laser radiation.

The novel flexographic printing element can be produced, for example, by dissolving or dispersing all components in a suitable solvent and casting onto a substrate. In the case of multilayer elements, a plurality of layers can be cast one on top of the other in a manner known in principle. After the casting, it is possible, if desired, to apply the cover sheet for protecting the starting material from damage. Conversely, it is also possible to cast onto the cover sheet and finally to laminate the substrate therewith.

It has usually proven useful if the conductivity carbon black is first thoroughly premixed with the binder or part of the binder, for example in a kneader, and the further components are added only to this mixture. A very homogeneous distribution of the conductivity carbon black in the layer (A) is achieved as a result. The crosslinking can then be effected in a manner known in principle according to the chosen crosslinking technique by irradiation with electron beams or with actinic light or by heating.

Layers containing thermoplastic elastomeric binders can also be produced in a manner known in principle by means of extrusion and calendering between a cover sheet and a substrate film. This technique is particularly advisable when crosslinking is to be effected photochemically or by means of electron beams. It can in principle also be used in the case of thermal crosslinking. Here, however, it is necessary to ensure the use of a thermal initiator which does not as yet decompose at the temperature of extrusion and calendering and does not polymerize the layer prematurely.

It is of course also possible to use combinations of different production techniques. For example, the layer (A) can be cast on a peelable PET film. Layer (B) can be produced by means of extrusion and calendering between a substrate film and a cover element, the PET film coated with the layer (A) being used as cover element, similarly to the procedure described by EP-B 084 851. In this way, a firmly adhering laminate is achieved between the two layers. The entire laminate can then be crosslinked by means of electron beams. Layer (A) can also be crosslinked, for example thermally, immediately after casting. Layer (B) can be crosslinked, for example photochemically by irradiation through the substrate film, after assembly of the laminate.

The novel flexographic printing element is preferably used for the production of flexographic printing plates by means of direct laser engraving. However, a printing relief can of course also be engraved in another manner, for example mechanically.

In direct laser engraving, the relief layer absorbs laser radiation to such an extent that it is removed or at least detached in those areas in which it is exposed to a laser beam of sufficient intensity. Preferably, the layer is vaporized or thermally or oxidatively decomposed before melting, so that its decomposition products are removed from the layer in the form of hot gases, vapors, fumes or small particles.

Owing to the content of conductivity carbon black, layer (A) has good absorption particularly in the entire infrared spectral range from 750 nm to 12 000 nm. It can therefore be engraved equally well by means of $CO_2$ lasers having a wavelength of 10.6 μm or by means of Nd—YAG lasers (1 064 nm), IR diode lasers or solid-state lasers.

In the case of layer (B), the choice of the optimum laser depends on the composition of the layer, in particular on whether an absorber for laser radiation (b2) is present or not. The binders used for layer (B) and typical for flexographic printing absorb in the range from 9 000 nm to 12 000 nm, usually to a sufficient extent to permit engraving of the layer with $CO_2$ lasers without it being necessary to add additional IR absorbers. The same applies to UV lasers, for example excimer lasers. With the use of Nd—YAG lasers and IR diode lasers, the addition of a laser absorber is generally necessary. The lasers can be operated either continuously or pulsed.

The depth of the elements to be engraved depends on the total thickness of the relief and the type of elements to be engraved and is determined by a person skilled in the art according to the desired properties of the printing plate. The depth of the relief elements to be engraved is at least 0.03 mm, preferably 0.05 mm, the minimum depth between individual dots being stated here. Printing plates having excessively small relief depths are as a rule unsuitable for printing by means of a flexographic printing technique because the negative elements fill with printing ink. Individual negative dots should usually have greater depths; for those of 0.2 mm diameter, a depth of at least from 0.07 to 0.08 mm is usually advisable. In the case of surfaces removed by engraving, a depth of more than 0.15 mm, preferably more than 0.3 mm, is advisable. The latter is of course possible only in the case of a correspondingly thick relief.

Engraving can be effected using a laser system which has only a single laser beam. However, laser systems which have two or more laser beams are preferably used. The laser beams may all have the same wavelength, or laser beams of different wavelengths may be used. Furthermore, it is preferable if at least one of the beams is specially adapted for the production of coarse structures and at least one of the beams specially adapted for writing fine structures. By means of such systems, it is possible to produce high-quality printing plates in a particularly elegant manner.

For example, the lasers may be exclusively $CO_2$ lasers, the beam for producing the fine structures having a lower power than the beams for producing coarse structures. For example, the combination of a beam having a power of from 50 to 100 W with two beams of 200 W each has proven particularly advantageous. The laser may also be an Nd/YAG laser for writing fine structures, in combination with one or more powerful $CO_2$ lasers. Multibeam laser systems particularly suitable for laser engraving and suitable engraving methods are known in principle and are disclosed, for example, in EP-A 1 262 315 and EP-A 1 262 316. The apparatus described has a rotatable drum on which the flexographic printing element is mounted, and the drum is rotated. The laser beams move slowly parallel to the drum axis from one end to the other end of the drum and are modulated in a suitable manner. In this way, the total area of the flexographic printing element can be gradually engraved. Drum and laser beams can be moved relatively to one another by moving the laser and/or the drum.

Preferably, only the edges of the relief elements and the uppermost layer section of the relief-forming layer are engraved by means of the beam for producing fine structures. The more powerful beams preferably serve for deepening the structures produced and for excavating greater nonprinting depressions. The details do of course also depend on the subject to be engraved.

Such multibeam systems can be used for engraving the novel flexographic printing elements having only one layer (A). They are particularly advantageously used in combination with a multilayer flexographic printing element having a layer (A) and one or more layers (B). In this case, the thickness of the top layer (A) and the power of the less powerful laser beam and the other laser parameters are particularly advantageously tailored to one another so that the less powerful beam engraves substantially layer (A) while the more powerful beams together engrave substantially layer (B) or (A) and (B) together. As a rule, a layer thickness of from 0.05 to 0.3 mm, preferably from 0.07 to 0.2 mm, is sufficient for the top layer (A).

The flexographic printing plate obtained can advantageously be subsequently cleaned in a further process step after the laser engraving. In some cases, this can be effected by simply blowing off with compressed air or brushing off.

However, it is preferable to use a liquid cleaning agent for the subsequent cleaning in order to be able also to remove polymer fragments completely. This is advisable, for example, particularly when the flexographic printing plate is to be used for printing food packagings for which particularly stringent requirements with respect to volatile components are applicable.

The subsequent cleaning can very particularly advantageously be effected by means of water or an aqueous cleaning agent. Aqueous cleaning agents substantially comprise water and optionally small amounts of alcohols and may contain assistants, for example surfactants, emulsifiers, dispersants or bases, for supporting the cleaning process. It is also possible to use mixtures which are usually used for developing conventional, water-developable flexographic printing plates.

In principle, mixtures of organic solvents may also be used for the subsequent cleaning, in particular those mixtures which usually serve as washout agents for conventionally produced flexographic printing plates. Examples include washout agents based on high-boiling, dearomatized mineral oil fractions, as disclosed, for example, by EP-A 332 070, or water-in-oil emulsions, as disclosed by EP-A 463 016.

The subsequent cleaning can be effected, for example, by simple immersion or spraying of the relief printing plate or can be additionally supported by mechanical means, for example by brushes or plush pads. Conventional flexographic washers can also be used.

In the subsequent washing step, any deposits and the residues of the additional polymer layer are removed. Advantageously, this layer prevents polymer droplets formed in the course of the laser engraving from binding firmly to the surface of the relief layer again, or at least makes said binding more difficult. Deposits can therefore be removed particularly easily. It is usually advisable to carry out the subsequent washing step immediately after the laser engraving step.

By the use of conductivity carbon blacks in the novel flexographic printing elements, very high-quality flexographic printing plates are obtained. Although the conductivity carbon black is not quite as sensitive as conventional carbon blacks, it is possible to obtain flexographic printing plates whose relief elements have very crisp edges, and the occurrence of melt edges is virtually completely suppressed.

The examples which follow illustrate the invention:

EXAMPLE 1

One-layer flexographic printing element comprising conductivity carbon black

The following starting materials are used for the elastomeric, relief-forming layer (A):

| | |
|---|---|
| SBS oil compound consisting of: | 53% |
| 67 parts of SBS three-block copolymer | |
| (30% of styrene, $M_w$ = 170 000 g/mol) | |
| 33 parts of paraffinic mineral oil | |
| SB two-block copolymer (9% of styrene, | 9% |
| $M_w$ = 230 000 g/mol) | |
| Polybutadiene oil plasticizer | 18% |
| 1,6-Hexanediol diacrylate | 9% |
| Kerobit TBK (thermal stabilizer) | 1% |
| Ketjenblack EC 300 J | 10% |
| (conductivity carbon black, | |
| BET = 800 m$^2$/g, | |
| DBP adsorption = 310–345 ml/100 g) | |
| Total | 100% |

Flexographic printing elements of the novel composition described above are produced by extrusion (ZSK 53 twin-screw extruder, Werner & Pfleiderer) and subsequent calendering of the melt between a PET substrate film (125 μm) coated with a mixture of adhesive-forming components and a silicone-coated protective film. The carbon black is metered with the aid of a flange-connected side extruder so that homogeneous metering and mixing of the carbon black into the polymer melt are ensured. The thickness of layer (A) is 1.02 mm.

After the production, the carbon black-filled flexographic printing elements are stored for 4 days at room temperature and then crosslinked with the aid of electron beams by the process described in WO 03/11596. For this purpose, in each case 5 flexographic printing elements are packed with intermediate layers in a carton and crosslinked by irradiation with electron beams (electron energy 3.5 MeV) in 4 doses of 25 kGy each.

After the protective film has been peeled off, a test subject having a resolution of 1 270 dpi is engraved into the crosslinked, carbon black-filled flexographic printing element by means of a laser system comprising three $CO_2$ laser beams (STK BDE 4131, Kufstein screen technique, 1st beam 100 watt, 2nd and 3rd beams 250 watt). The test subject contains various, typical elements, such as dots, solid areas, nonprinting parts, fine positive and negative points and lines, for assessing the quality of the engraving. After the engraving, the surface is cleaned manually using a brush with a water/surfactant mixture and is dried. The test conditions and results are summarized in table 1.

COMPARATIVE EXAMPLES A, B and C

One-layer flexographic printing elements comprising nonconductive carbon black grades Flexographic printing elements were produced by means of extrusion and calendering of the melt between a PET substrate film coated with a mixture of adhesive-forming components and a silicone-coated protective film, similarly to example 1. The composition of the elastomeric layer corresponded to that of example 1, but different, nonconductive carbon black grades were used. The carbon black used in each case is shown in the table below:

| | |
|---|---|
| Comparative example A | Printex ® U<br>(gas black, BET = 100 m$^2$/g,<br>DBP adsorption = 115 ml/100 g) |
| Comparative example B | Printe ®x A<br>(furnace black, BET = 45 m$^2$/g,<br>DBP adsorption = 118 ml/100 g) |
| Comparative example C | Spezialschwarz ® 4<br>(gas black, BET = 180 m$^2$/g,<br>DBP adsorption = 88 ml/100 g) |

The carbon black-containing flexographic printing elements are crosslinked by irradiation with electron beams (electron energy 3.5 MeV) in 4 doses of 25 kGy each, similarly to example 1.

After the protective film has been peeled off, the test subject of example 1 is engraved into the crosslinked flexographic printing element by means of a laser. The test conditions and results are summarized in table 1.

TABLE 1

| | | Example | | | |
|---|---|---|---|---|---|
| | | 1 | A | B | C |
| Carbon black product name | | Ketjenblack EC 300 J | Printex U | Printex A | Spezial-schwarz 4 |
| Amount of carbon black | [%] | 10 | 10 | 10 | 10 |
| DBP | [ml/100 g] | 310–345 | 115 | 118 | 88 |
| BET | [m$^2$/g] | 800 | 100 | 45 | 180 |
| Mean primary particle size | [nm] | — | 25 | 41 | 25 |
| Carbon black type | | highly conductive | gas black | furnace black | gas black |
| pH | | 8 to 10 | 4.5 | 9 | 3 |
| Crosslinking conditions | | | | | |
| Electron irradiation | [kGy] | 100 | 100 | 100 | 100 |
| Laser engraving parameters | | | | | |
| Laser | | STK BDE 4131 | STK BDE 4131 | STK BDE 4131 | STK BDE 4131 |
| Setting of laser 1 | | 38 | 38 | 38 | 38 |
| Setting of laser 2 | | 80 | 80 | 80 | 80 |
| Setting of laser 3 | | 80 | 80 | 80 | 80 |
| Speed | m/sec | 7 | 7 | 7 | 7 |
| Laser engraving result | | | | | |
| Engraving depth | [μm] | 555 | 565 | 585 | 545 |

TABLE 1-continued

| | | Example | | | |
|---|---|---|---|---|---|
| | | 1 | A | B | C |
| Negative dot [400 μm] diameter | [μm] | 432 | 461 | 460 | 446 |
| Negative dot [400 μm] depth | [μm] | 249 | 290 | 250 | 275 |
| Negative dot [200 μm] diameter | [μm] | 228 | 254 | 258 | 248 |
| Negative dot [200 μm] depth | [μm] | 113 | 110 | 108 | 108 |

Test conditions and results of example 1 and of comparative examples A, B and C

The engraving results clearly show that the use of conductivity carbon black instead of nonconductive carbon blacks leads to improved resolution. This is evident in particular from the fact that negative elements have a smaller diameter at comparable engraving depths. The reason for this is the fact that the edges melt to a lesser extent.

Furthermore, no pronounced deposits and fragments form, with the result that even fine elements print with crisp contours.

Figure 2:
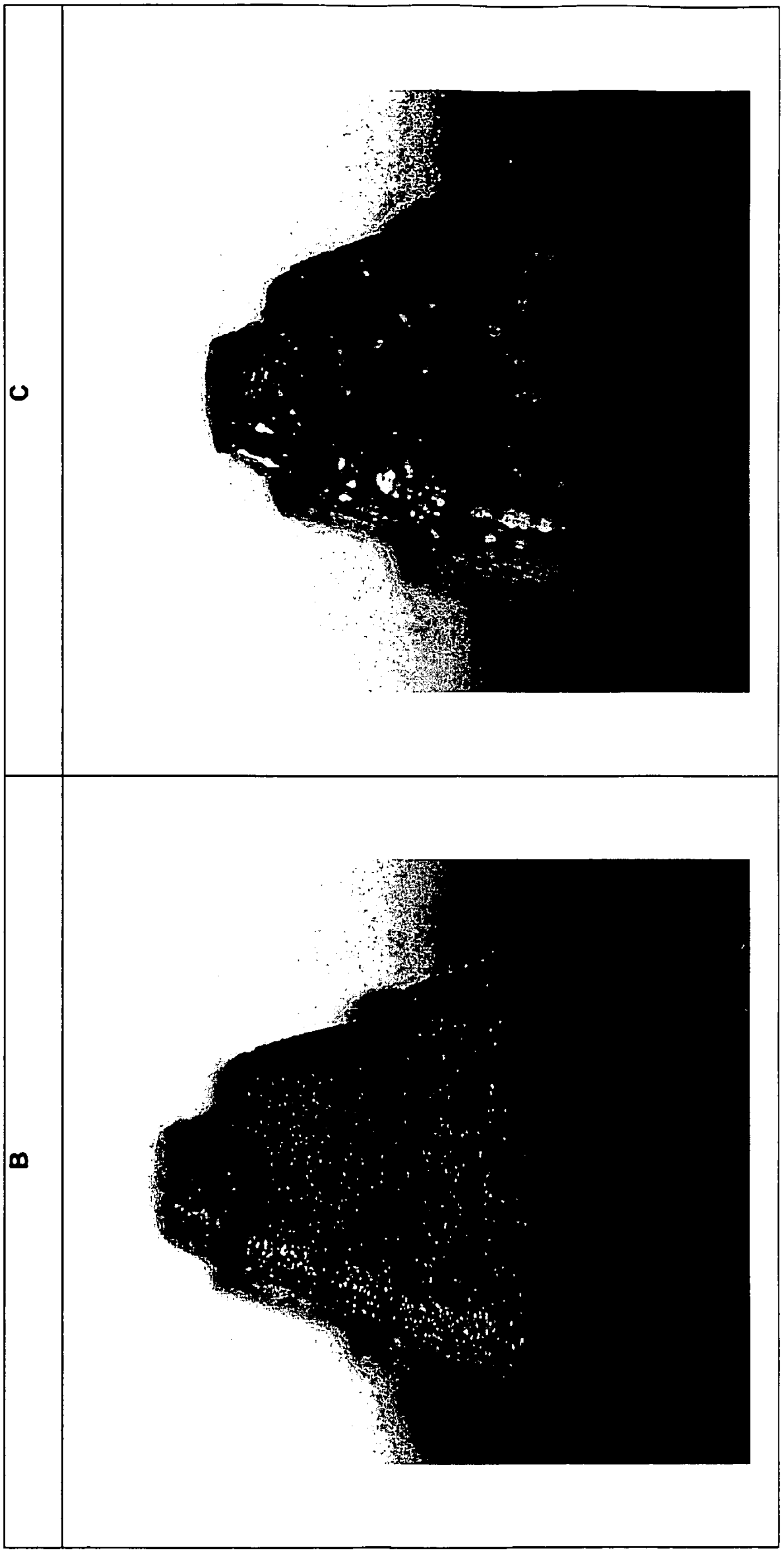

The smoothness of the surface is particularly clearly evident from fine positive elements. FIGS. 1 and 2 show optical micrographs of a 50 μm positive dot of a flexographic printing plate according to example 1 and according to comparative examples A, B and C.

The figures clearly demonstrate that, by using conductivity carbon black (example 1), a substantially smoother surface and less surface soiling and fewer fragments of printing elements are obtained, in contrast to other carbon blacks (comparative examples A, B and C).

EXAMPLE 2

Two-layer flexographic printing element comprising a layer (A) and a layer (B)

A 100 μm thick, elastomeric layer (A) according to example 1 was first produced by means of extrusion between 2 siliconized protective films. After the crosslinking of the layer by means of electron beams similarly to example 1, one of the siliconized films was peeled off in order to obtain a cover element.

The components for the photochemically crosslinkable layer (B) were the components of a nyloflex® FAH printing plate (BASF Drucksysteme GmbH).

The two-layer flexographic printing element was produced in a conventional manner according to the process described in EP-A 084 851 by melt extrusion of the components of layer (B) and calendering between a transparent substrate film and a cover element, said laminate comprising layer (A) and siliconized film being used as the cover element. A laminate comprising a photochemically crosslinkable, elastomeric layer (B) and a top layer (A) containing conductivity carbon black was thus produced. The thickness of layer (B) was 0.92 mm.

For photochemical crosslinking, layer (B) was exposed to UV/A light through the transparent substrate film for 20 minutes (nyloflex F III exposure unit, 80 watt tubes). The siliconized cover sheet was then peeled off.

The flexographic printing element described can alternatively be obtained by laminating the laminate described above and comprising layer (A) and film with a prepared FAH plate.

The two-layer flexographic printing element comprising the layers (A) and (B) is engraved using a two-beam laser unit (100 W Nd—YAG, 250 W $CO_2$) with different resolutions (1 270 dpi, 1 778 dpi, 2 540 dpi).

The fine elements were engraved in crosslinked layer (A) by means of the Nd—YAG laser, and the $CO_2$ laser served for engraving the deeper regions and, if required, for excavating coarse regions. The achievable resolution was 2 540 dpi with simultaneous formation of crisp edges of fine printing elements.

EXAMPLE 3

Two-layer flexographic printing element comprising a layer (A) and a layer (B)

A vulcanizable natural rubber/carbon black mixture of the following composition is first produced on a roll mill:

| | |
|---|---|
| Natural rubber (Norrub 340P) | 84% |
| Heat stabilizer (Vulkanox 4010 NA/LG) | 1% |
| Stearic acid | 1% |
| Zinc oxide (zinc oxide RS P5) | 2% |
| Sulfur crosslinking system | 3% |
| Ketjenblack EC 300 J (conductivity carbon black, BET = 800 $m^2/g$, DBP adsorption = 310–345 ml/100 g) | 9% |
| Total | 100% |

By pressing the layer for 20 minutes between two siliconized protective films at 150° C., a 100 μm thick, crosslinked elastomeric layer (A) is obtained. A protective film is peeled off before further processing.

The components for the photochemically crosslinkable layer (B) were the components of a nyloflex® FAH printing plate (BASF Drucksysteme GmbH).

The two-layer flexographic printing element was produced in a conventional manner according to the process described in EP-A 084 851 by melt extrusion of the components of layer (B) and calendering between a transparent substrate film and a cover element, said laminate comprising layer (A) and siliconized film being used as cover element. A laminate comprising a photochemically crosslinkable, elastomeric layer (B) and a top layer (A) containing conductivity carbon black was thus produced. The thickness of layer (B) was 0.92 mm.

For photochemical crosslinking, layer (B) was exposed to UV/A light through the transparent substrate film for 20 minutes (nyloflex F III exposure unit, 80 watt tubes). The siliconized cover sheet was then peeled off.

The flexographic printing element described can alternatively be obtained by laminating the laminate described above and comprising layer (A) and film with a prepared FAH plate.

The two-layer flexographic printing element comprising the layers (A) and (B) was engraved using a two-beam laser unit (100 W Nd—YAG, 250 W $CO_2$) with different resolutions (1 270 dpi, 1 778 dpi, 2 540 dpi).

The fine elements were engraved in crosslinked layer (A) by means of the Nd—YAG laser, and the $CO_2$ laser served for engraving the deeper regions and, if required, for excavating the coarse regions. The achievable resolution was 2 540 dpi with simultaneous formation of crisp edges of fine printing elements.

COMPARATIVE EXAMPLE D

For comparison, the two-layer flexographic printing element from example 2 was engraved only with a 250 W $CO_2$ one-beam laser unit.

The achievable resolution for the reproduction of screens is not more than 1 270 dpi. Fine relief elements have sidewalls with a coarser structure than in example 2.

The fine elements can be engraved using the combination of Nd/YAG laser and $CO_2$ laser with finer resolution than when only the $CO_2$ laser is used. Fine dots are substantially more pointed.

COMPARATIVE EXAMPLE E

For comparison, the two-layer flexographic printing element from example 3 was engraved only with a 250 W $CO_2$ one-beam laser unit.

The achievable resolution for the reproduction of screens is not more than 1 270 dpi. Fine relief elements have sidewalls with a coarser structure than in example 3.

The fine elements can be engraved using the combination of Nd/YAG laser and $CO_2$ laser with finer resolution than when only the $CO_2$ laser is used. Fine dots are substantially more pointed and the sidewalls of the elements have no fragments.

We claim:

1. A flexographic printing element for the production of flexographic printing plates by means of laser engraving, at least comprising, arranged one on top of the other, a dimensionally stable substrate and at least one relief-forming, crosslinked, elastomeric layer (A) having a thickness of from 0.05 to 7 mm, obtainable by crosslinking a layer which comprises at least one binder (a1), a substance (a2) absorbing laser radiation and at least one crosslinking component (a3), wherein the substance (a2) absorbing laser radiation is a conductivity carbon black having a specific surface area of at least 150 $m^2/g$ and a DBP number of at least 150 ml/100 g.

2. A flexographic printing element as claimed in claim 1, wherein the substance is a conductivity carbon black having a specific surface area of at least 500 $m^2/g$ and a DBP number of at least 250 ml/100 g.

3. A flexographic printing element as claimed in claim 1, which comprises at least one further, relief-forming, crosslinked elastomeric layer (B) between the substrate and the layer (A), obtainable by crosslinking a layer which comprises at least one binder (b1) and at least one crosslinking component (b3).

4. A flexographic printing element as claimed in claim 3, wherein the binder (b1) is a thermoplastic elastomeric binder.

5. A flexographic printing element as claimed in claim 3, wherein layer (B) furthermore comprises a substance (b2) absorbing laser radiation.

6. A flexographic printing element as claimed in claim 3, wherein the binder (a1) in layer (A) is a natural or synthetic rubber.

7. A process for the production of flexographic printing plates, wherein a flexographic printing element as claimed in claim 1 is used, and a printing relief is engraved with the aid of a laser system into the layer (A), wherein the depth of the relief elements to be engraved by means of the laser is at least 0.03 mm.

8. A process as claimed in claim 7, wherein the laser system is a laser system having two or more laser beams.

9. A process as claimed in claim 8, wherein at least one of the laser beams is used for producing coarse structures and at least one for producing fine structures.

10. A process as claimed in claim 7, wherein the flexographic printing element used comprises at least one further, relief-forming, crosslinked elastomeric layer (B) between the substrate and the layer (A), obtainable by crosslinking a layer which comprises at least one binder (b1) and at least one crosslinking component (b3), wherein the process comprising engraving the printing relief with the aid of the laser system into both layers (A) and (B).

* * * * *